(12) United States Patent
Yang et al.

(10) Patent No.: US 6,709,883 B2
(45) Date of Patent: *Mar. 23, 2004

(54) LIGHT EMITTING DIODE AND METHOD OF MAKING THE SAME

(75) Inventors: Kuang-Neng Yang, Yunlin (TW); Tzer-Perng Chen, Hsinchu (TW); Chih-Sung Chang, Taipei (TW)

(73) Assignee: United Epitaxy Co., Ltd. (TW)

( * ) Notice: Subject to any disclaimer, the term of this patent is extended or adjusted under 35 U.S.C. 154(b) by 55 days.

This patent is subject to a terminal disclaimer.

(21) Appl. No.: 09/828,060

(22) Filed: Apr. 6, 2001

(65) Prior Publication Data

US 2002/0105003 A1 Aug. 8, 2002

(30) Foreign Application Priority Data

Feb. 6, 2001 (TW) .......................... 90102561 A

(51) Int. Cl.[7] .............................................. H01L 21/00
(52) U.S. Cl. .............................. 438/47; 438/46; 438/93; 438/94; 438/98
(58) Field of Search .............................. 257/12, 13, 79, 257/94, 96, 97, 102; 438/46, 47, 93, 94, 98

(56) References Cited

U.S. PATENT DOCUMENTS

| | | | | |
|---|---|---|---|---|
| 5,256,599 A | * | 10/1993 | Asetta et al. | 156/154 |
| 5,300,788 A | * | 4/1994 | Fan et al. | 257/13 |
| 5,376,580 A | * | 12/1994 | Kish et al. | 438/26 |
| 5,403,916 A | * | 4/1995 | Watanabe et al. | 257/72 |
| 5,656,552 A | * | 8/1997 | Hudak et al. | 438/107 |
| 5,724,376 A | * | 3/1998 | Kish et al. | 372/36 |
| 5,764,119 A | * | 6/1998 | Miyagi et al. | 174/250 |
| 5,837,561 A | * | 11/1998 | Kish et al. | 438/24 |
| 5,917,202 A | * | 6/1999 | Haitz et al. | 257/98 |
| 6,013,534 A | * | 1/2000 | Mountain | 438/15 |
| 6,017,822 A | * | 1/2000 | Mountain | 438/692 |
| 6,066,574 A | * | 5/2000 | You et al. | 438/778 |
| 6,146,992 A | * | 11/2000 | Lauterbach et al. | 438/459 |
| 6,258,699 B1 | * | 7/2001 | Chang et al. | 206/710 |
| 6,287,882 B1 | * | 9/2001 | Chang et al. | 438/29 |
| 6,319,778 B1 | * | 11/2001 | Chen et al. | 257/94 |
| 6,333,592 B1 | * | 12/2001 | Sasa et al. | 313/110 |
| 6,396,082 B1 | * | 5/2002 | Fukasawa et al. | 257/100 |

OTHER PUBLICATIONS

Vanderwater et al., "High–Brightness AlGaInP Light Emitting Diodes", Nov. 1997, Proceddings of the IEEE, pp. 1752–1764.*

* cited by examiner

Primary Examiner—Matthew Smith
Assistant Examiner—Lex H Malsawma
(74) Attorney, Agent, or Firm—Rabin & Berdo, P.C.

(57) ABSTRACT

A light emitting diode (LED) and method of making the same are disclosed. The present invention uses a layer of elastic transparent adhesive material to bond a transparent substrate and a LED epitaxial structure having a light-absorbing substrate. The light absorbing substrate is then removed to form a LED having a transparent substrate. By the use of the transparent substrate, the light emitting efficiency of the LED can be significantly improved.

14 Claims, 4 Drawing Sheets

LIGHT EMITTING DIODE AND METHOD OF MAKING THE SAME

FIELD OF THE INVENTION

The present invention relates to a structure and a method of making a light emitting diode (LED) chip, and more particularly to a structure and a method of making an AlGaInP LED chip.

BACKGROUND OF THE INVENTION

The conventional AlGaInP LED, as shown in FIG. 4, has a double heterostructure (DH), which is consisted of an n-type $(Al_xGa_{1-x})_{0.5}In_{0.5}P$ lower cladding layer 4 with an Al composition of about 70%~100%, formed on a n-type GaAs substrate 3, an $(Al_xGa_{1-x})_{0.5}In_{0.5}P$ active layer 5, a p-type $(Al_xGa_{1-x})_{0.5}In_{0.5}P$ upper cladding layer 6 with an Al composition of about 70%~100% and a p-type high energy gap GaAsP, InGaP, AlGaP, GaP, or AlGaAs current spreading layer 7. The emitting wavelength of the conventional LED structure can be changed by adjusting composition of the active layer to generate a wavelength changed from 650 nm red to 555 nm pure green. One disadvantage of the conventional LED is that, when the light generated by the active layer is emitted downward to the GaAs substrate, the light will be absorbed by the GaAs substrate since the GaAs substrate has a smaller energy gap. Accordingly, the light-output performance of the LED will be greatly reduced.

There are some conventional LED technologies have been disclosed in order to avoid the absorption of light by the substrate. However, these conventional technologies still have some disadvantages and limitations. For example, Sugawara et al. disclosed a method, which has been published in Appl. Phys Lett. Vol. 61, 1775–1777 (1992), that adding a distributed bragg reflector (DBR) layer on the GaAs substrate so as to reflect the light emitted downward to the GaAs substrate and to decrease the light absorbed by the GaAs substrate. However, because the DBR layer only reflects light that is of near normal incidence to the GaAs substrate, so that the efficiency is not very great.

Kish et al. disclosed a wafer-bonded transparent-substrate (TS) $(Al_xGa_{1-x})_{0.5}In_{0.5}P/GaP$ light emitting diode [Appl. Phys Lett. Vol. 64, No. 21, 2839 (1994); Very high-efficiency semiconductor wafer-bonded transparent-substrate $(Al_xGa_{1-x})_{0.5}In_{0.5}P/GaP$]. This TS AlGaInP LED was fabricated by growing a very thick (about 50 μm) p-type GaP window layer using hydride vapor phase epitaxy (HVPE). Before bonding, the n-type GaAs substrate was selectively removed using chemical mechanical polishing and etching techniques. The exposed n-type $(Al_xGa_{1-x})_{0.5}In_{0.5}P$ claddng layers are subsequently wafer-bonded to 8–10 mil thick n-type GaP substrate. The resulting TS AlGaInP LED exhibits a two fold improvement in light output compared to absorbing substrate (AS) AlGaInP LED. However, the fabrication process of TS AlGaInP LED is too complicated. Therefore, it is difficult to manufacture these TS AlGaInP LEDs in high yield and low cost.

Horng et al. reported a mirror-substrate (MS) AlGaInP/metal/SiO_2/Si LED fabricated by wafer-fused technology [Appl. Phys Lett. Vol. 75, No. 20, 3054 (1999); AlGaInP light-emitting diodes with mirror substrates fabricated by wafer bonding]. They used the AuBe/Au as the adhesive to bond the Si substrate and LED epilayers. However, the luminous intensity of these MS AlGaInP LEDs is about 90 mcd with 20 mA injection current and is still 40% lower than the luminous intensity of TS AlGaInP LED.

SUMMARY OF THE INVENTION

As described above, the conventional LED has many disadvantages. Therefore, the present invention provides a LED structure and method of making the same to solve the conventional disadvantages.

The present invention provides a light emitting diode. A light emitting diode, the light emitting diode comprises a LED epitaxial structure having a multi-layered AlGaInP epitaxial structure formed on a light-absorbing substrate; a transparent substrate; and a layer of transparent adhesive material for bonding the transparent substrate and the multi-layered AlGaInP epitaxial structure. The active layer of the LED can be composed of single heterostructure (SH), double heterostructure (DH), multi quantum wells (MQWs), or quantum wells heterostructure (QWHs). Meanwhile, a first and a second ohmic contact metal layer are bonded to a first and a second conductive-type epitaxial layers, respectively. Besides, both the first and second ohmic contact metal layers are located on the same side.

The present invention provides a method for manufacturing a light emitting diode, which comprises the steps of: providing a LED epitaxial structure having a multi-layered AlGaInP epitaxial structure formed on a light-absorbing substrate; providing a transparent substrate and using a layer of transparent adhesive material, for example, BCB (B-staged bisbenzocyclobutene) resin or Epoxy resin, to bond the transparent substrate and the multi-layered AlGaInP epitaxial structure. The light-absorbing substrate is then removed to expose the first conductive-type etching stop layer so that a first ohmic contact metal layer is, for example, formed. The etching step also exposes the second conductive type epitaxial layer to form a second ohmic contact layer. In addition, both the first and second ohmic contact metal layers are located on the same side.

An advantage of the present invention is to provide a simple LED structure, the adhesion process of the LED structure can be performed at lower temperature to avoid the evaporation problem of V group elements. Moreover, by the use of the transparent substrate, the light emitting efficiency of the LED can be significantly improved.

Another advantage of the present invention is the simplified process, wherein the low cost glass can be used as the material of the transparent substrate. Accordingly, a through-put with high yield and low cost is achieved.

Another advantage of the present invention is the use of the elastic properties of transparent adhesive material to bond the transparent substrate and the multi-layered AlGaInP epitaxial structure. Therefore, an excellent boding result can be obtained by the use of the elastic transparent adhesive layer even if the epitaxial structure has a roughness surface.

BRIEF DESCRIPTIONS OF THE DRAWINGS

DETAILED DESCRIPTION OF THE PREFERRED EMBODIMENT

The present invention discloses a LED structure and method of making the same and will be described in detail as below.

Figure 1:
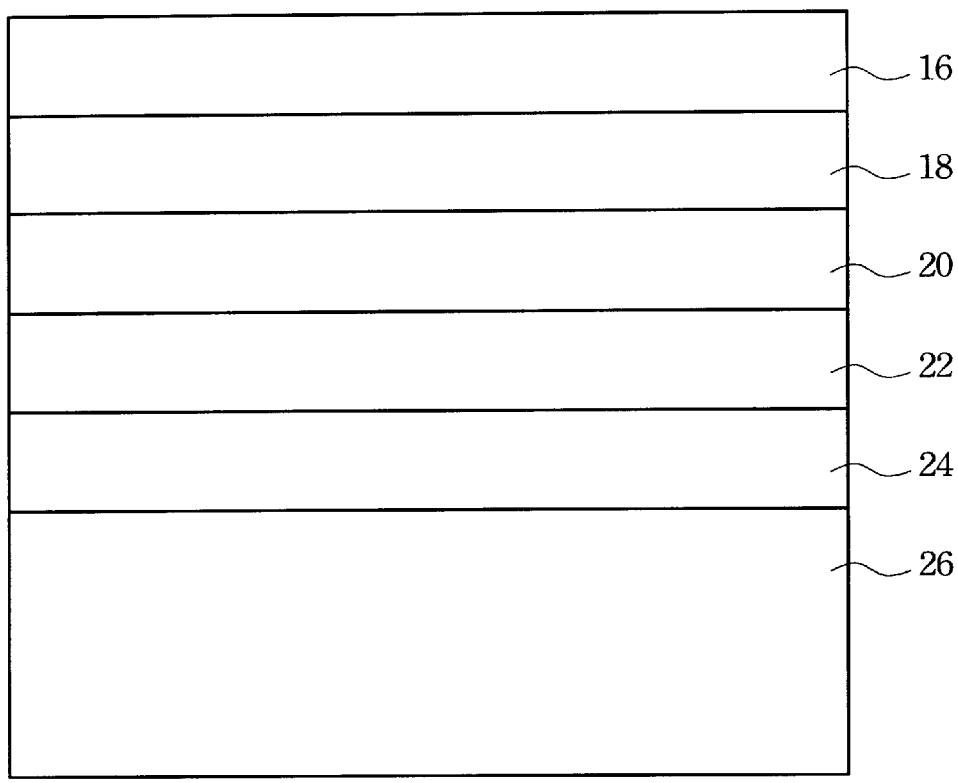
FIGS. 1–3 are schematic, cross-sectional views of the process for manufacturing a light emitting diode in a preferred embodiment according to the present invention.

Referring to FIG. 1, the epitaxial structure of light emitting diode of the present invention is composed of an n-type GaAs substrate 26, an etching stop layer 24, n-type $(Al_xGa1-x)_{0.5}In_{0.5}P$ lower cladding layer 22 and $(AlxGa1-x)_{0.5}In_{0.5}P$ active layer 20, p-type $(AlxGa1-x)_{0.5}In_{0.5}P$ upper cladding layer 18, and p-type ohmic contact epitaxial layer 16.

In the above description, the material of the p-type ohmic contact epitaxial layer can be AlGaAs, AlGaInP, or GaAsP, as along as the energy gap of the material is larger than that of the active layer, and no light emitted from the active layer is absorbed.

Moreover, the active layer has an Al composition of about $0 \leq x \leq 0.45$, the lower cladding layer has an Al composition of about $0.5 \leq x \leq 1$, the upper cladding layer has an Al composition of about $0.5 \leq x \leq 1$. If x=0, then the composition of the active layer is $Ga_{0.5}In_{0.5}P$, and the wavelength $\lambda$ d of the LED is 635 nm.

In the above description, the ratio of the compound such as $(Al_xGa_{1-x})_{0.5}In_{0.5}P$ is a preferred example, the invention is also applied to any ratio of III–V semiconductor material. In addition, the structure of the AlGaInP active layer 20 of the invention could be a SH structure, a DH structure, a multiple quantum wells (MQWs) structure, or a Quantum wells heterostructure (QWHs). The DH structure comprises the n-type $(Al_xGa_{1-x})_{0.5}In_{0.5}P$ lower cladding layer 22, an $(Al_xGa_{1-x})_{0.5}In_{0.5}P$ active layer 20 and a p-type $(Al_xGa_{1-x})_{0.5}In_{0.5}P$ upper cladding layer 18, as shown in FIG. 1, wherein the preferred thickness of the lower cladding layer 22, the active layer 20 and the upper cladding layer 18 are about 0.5~3.0, 0.5~2.0 and 0.5~3.0 $\mu$m, respectively.

The preferred material of the etching stop layer 24 of the invention can be any III–V compound semiconductor material that has a lattice matched /or mismatched with that of the GaAs substrate 26. The material of the etching stop layer 24 of the invention also has an etching rate much smaller than that of the GaAs substrate 26. For example, InGaP or AlGaAs can be good candidates of the etching stop layer 24. In addition, the n-type AlGaInP lower cladding layer has an etching rate much smaller than that of the GaAs substrate. Therefore, if the lower cladding layer has enough thickness, an optional epitaxial layer, which is used as an etching stop layer, with different composition is not necessary.

Figure 2:
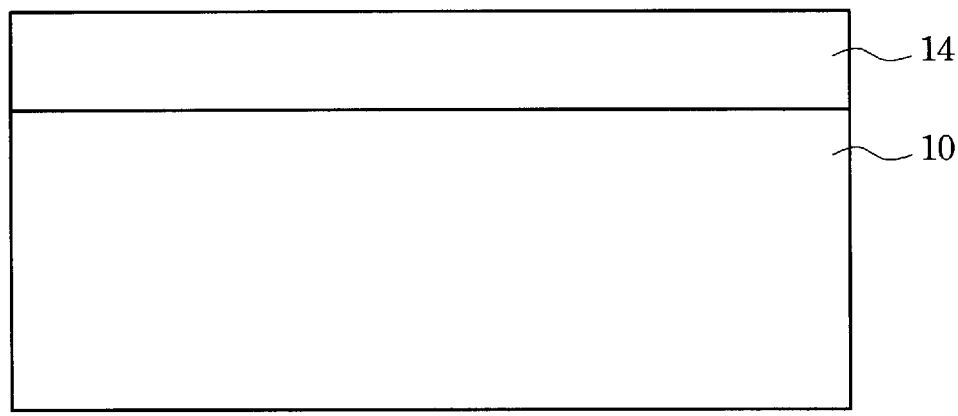

The structure as show in FIG. 2 comprises a transparent adhesive layer 14, for example, BCB (B-staged bisbenzocyclobutene) resin and a transparent substrate (TS) 10. The material of the adhesive layer 14 is not limited to BCB. Any adhesive material with similar property, such as Epoxy or other material, is also applicable to the invention. The transparent substrate can be composed of glass, sapphire wafer, SiC wafer, GaP wafer, GaAsP wafer, ZnSe wafer, ZnS wafer, or ZnSSe wafer. These materials can be chosen as the transparent substrate as long as the light absorbed by the material is minor. One advantage of the present invention is that the transparent substrate need not be single crystal wafer. The transparent substrate is used for supporting the LED epitaxial layer to avoid this epitaxial layer from breaking, the current does not flow through the transparent substrate. In other words, both the polycrystal and amorphous crystal can be used as the carrier substrate. Accordingly, the manufacture cost is significant decreased.

Figure 3:
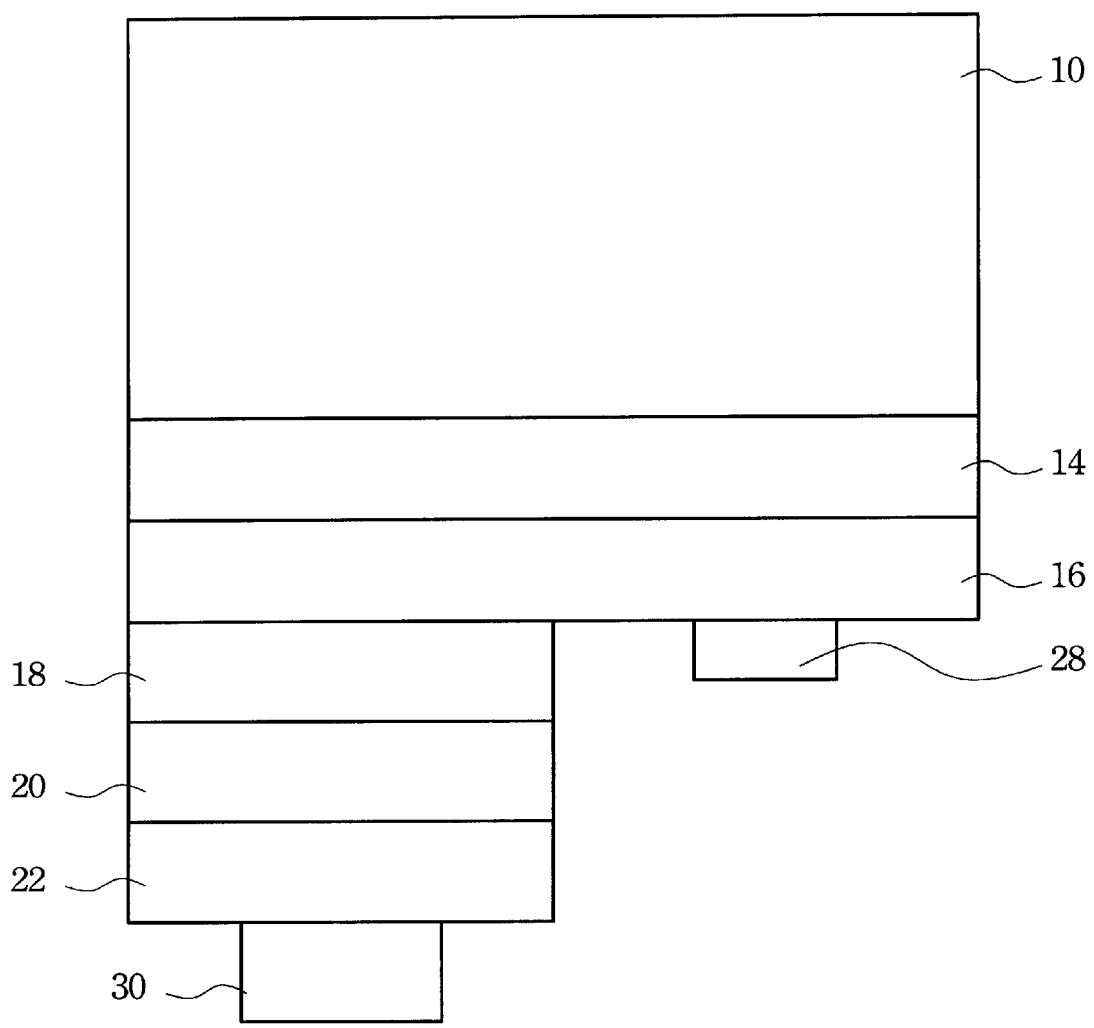
Figure 4:
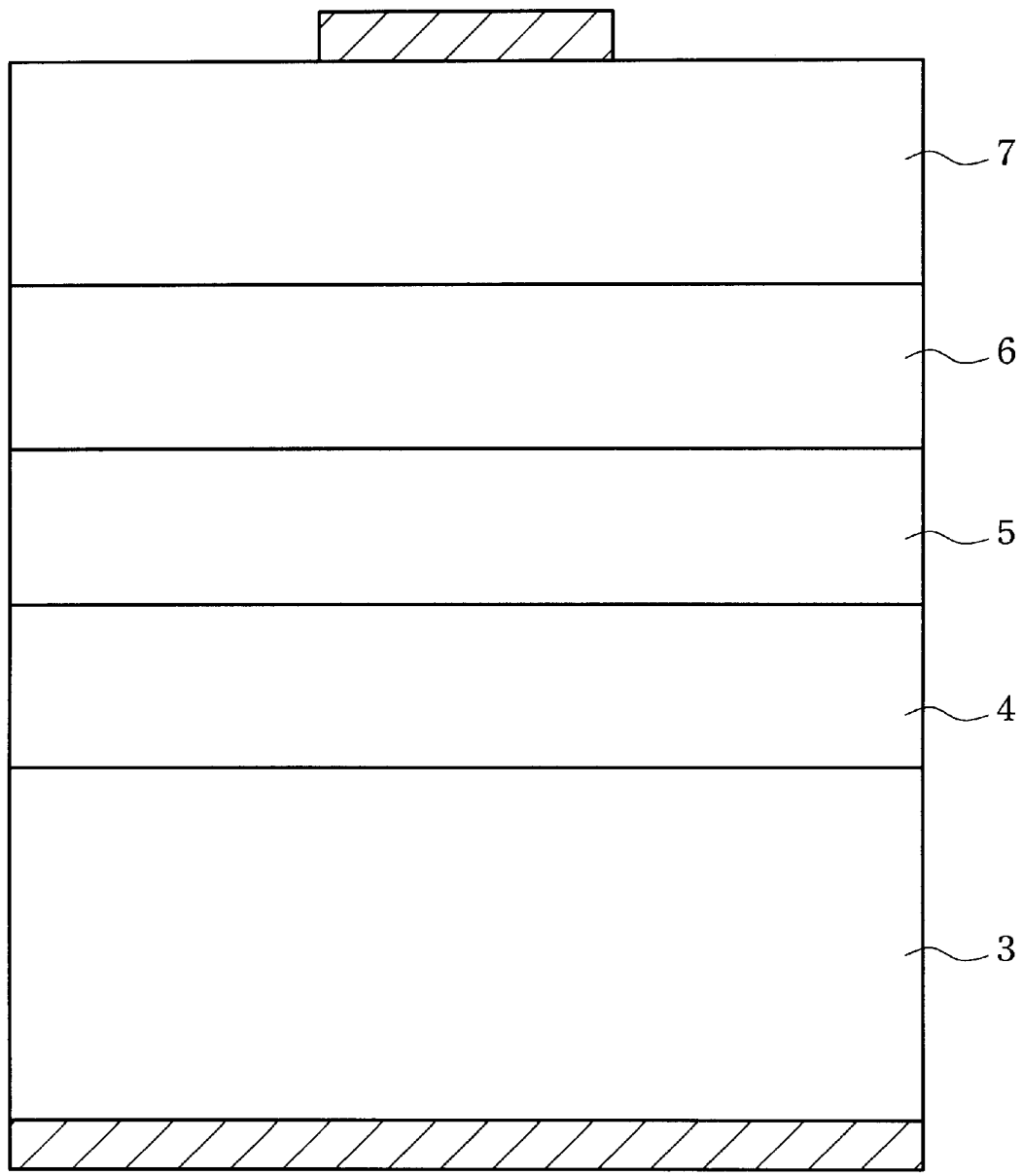
FIG. 4 is a schematic, cross-sectional view of structure of conventional light emitting diode.

Thereafter, the epitaxial layer structure of FIG. 1 is bonded together with the transparent substrate of FIG. 2. The adhesion step can be performed in a temperature, for example, 250° C., with pressure and heat, according to the method of the invention. A layer of adhesion promoter can be formed on the surface of the LED epitaxial structure and transparent substrate surface by, for example, deposition, evaporation, or sputtering, to improve the adhesion property between the LED epitaxial structure and the transparent substrate. After that, a BCB layer is coated, then a temperature, for example, 250° C., and a pressure are applied for a period to the complete the adhesion between the LED epitaxial structure and the transparent substrate. In order to provide better adhesion, the LED epitaxial structure and the transparent substrate bonded by the BCB layer, can be heated at a lower temperature, for example, 60° C. to 100° C., to remove the organic solvent in the BCB layer, and then the temperature is raised to a range between 200° C. and 600° C. so that the bonding strength of the LED epitaxial structure, the transparent substrate, and the BCB layer is excellent. Thereafter, the opaque n-type GaAs substrate is then removed by etchant, for example, $5H_3PO_4:3H_2O_2:3H_2O$ or $1NH_4OH:35H_2O_2$. However, the etching stop layer, InGaP or AlGaAs, still absorbs the light emitted from the active layer. Therefore, it is necessary to remove the etching stop layer and only remains a portion of this etching stop layer contacted with the n-type ohmic contact metal layer. A dry etching method, for example, RIE, is then applied to remove portions of the n-type AlGaInP lower cladding layer, AlGaInP active layer and p-type AlGaInP upper cladding layer to further expose the p-type ohmic contact epitaxial layer. A p-type ohmic contact metal layer 28 is then formed on the p-type ohmic contact epitaxial layer 16. A n-type ohmic contact metal layer 30 is thereafter formed on the n-type AlGaInP lower cladding layer 22 to form a LED structure with p-type and n-type ohmic contact metal layers formed on the same side, as shown in FIG. 3.

The light output power of the AlGaInP LED with wavelength 635 nm of the present invention is more than 4 mw (at 20 mA injection current) and is two times higher than the light output power of the conventional absorbing substrate AlGaInP LED.

Figure 5:
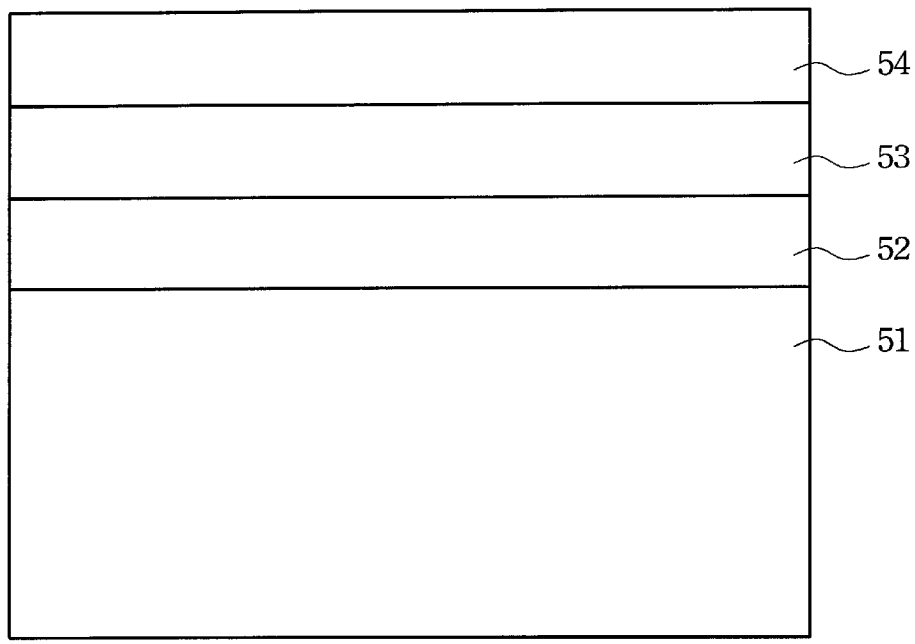
FIGS. 5–6 are schematic, cross-sectional views of structures of light emitting diode of the present invention.
Figure 6:
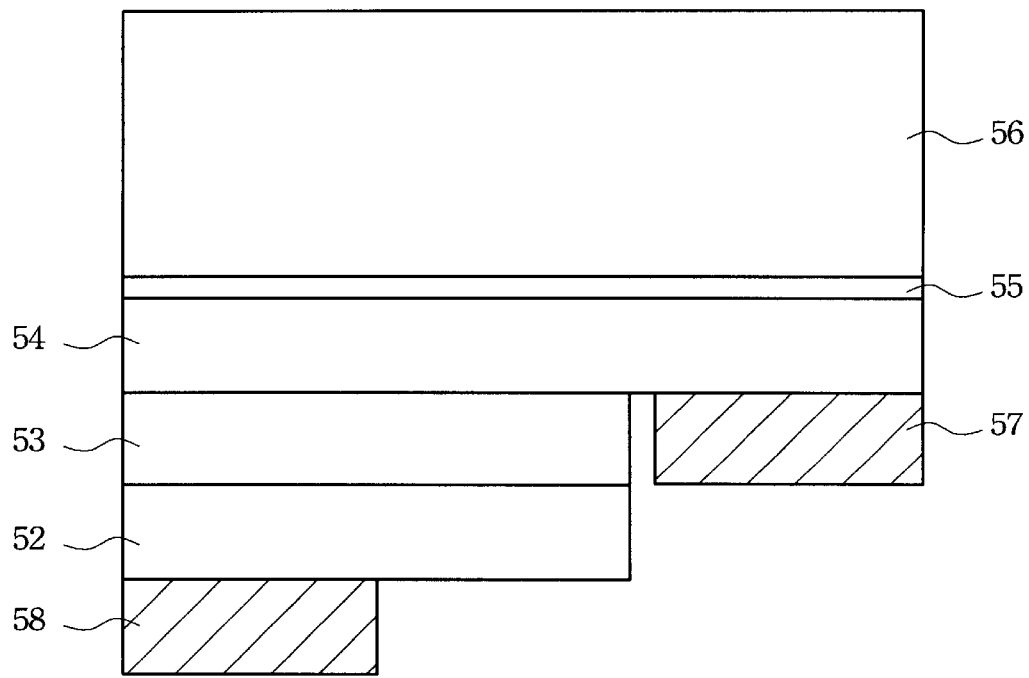

The present invention is not limited to the AlGaInP LED having high brightness, and is also suitable for other LED materials, for example, red and infrared-red AlGaAs LED. The epitaxial structure shown on FIG. 5 is a cross sectional view of the second embodiment of the present invention. The AlGaAs red LED (650 nm) includes a stacked structure of n-type GaAs substrate 51, n-type AlGaAs lower cladding layer 52 with Al composition of about 70~80% and thickness of 0.5 $\mu$m~2 $\mu$m, and a p-type AlGaAs upper cladding layer 54 with Al composition of about 70~80% and thickness of 0.5 $\mu$m~2 $\mu$m. The AlGaAs red LED structure is then bonded to a transparent substrate 56, for example, sapphire, by BCB 55. The epitaxial structure is then etched by an etchant, such as $NH_4OH:H_2O_2=1.7:1$ to remove the opaque n-type GaAs substrate. Thereafter, a wet etching or a dry etching is applied to remove portions of the n-type AlGaAs lower cladding layer and AlGaAs active layer and to further expose the p-type AlGaAs upper cladding layer. A p-type ohmic contact metal layer 57 is then formed on the p-type AlGaAs upper cladding layer 54. A n-type ohmic contact metal layer 58 is then formed on the n-type AlGaAs lower cladding layer 52 to form a LED structure with p type and n-type ohmic contact metal layers formed on the same side.

The light output power of the present invention AlGaAs LED is two times higher than the light output power of the conventional absorbing substrate AlGaAs LED. The AlGaAs LED of the present invention has a wavelength 650 nm, but is not limited thereto.

The LED is composed of transparent substrate, and both the p-type and n-type ohmic metal layer are formed on the same side of the transparent substrate, therefore a flip chip package method can be applied and the conventional wire bonding method is not necessary anymore. Therefore, the LED formed by the method of the present invention has a better reliability. Furthermore, no light is absorbed by the transparent substrate, therefore the brightness of the LED is improved. In addition, the transparent substrate can be composed of sapphire, glass or SiC with high hardness, therefore the thickness of the substrate can be down to 100 micrometers without breaking so that a LED structure with thin thickness and small size is manufactured.

One advantage of the present invention is the use of the elastic property of transparent adhesive material to bond the transparent substrate and the multi-layered AlGaInP epitaxial structure. Therefore, an excellent bonding result can be obtained by the use of the elastic property of transparent adhesive material even if the epitaxial structure has a roughness surface.

While the preferred embodiment of the invention has been illustrated and described, it will be appreciated that various changes can be made therein without departing from the spirit and scope of the invention.

What is claimed is:

1. A method of making a light emitting diode, comprising:
providing a LED epitaxial structure having a multi-layered AlGaAs epitaxial layer formed on a light-absorbing substrate, the multi-layered AlGaInP epitaxial structure having a first side and a second side, wherein the first side of the multi-layered AlGaInP epitaxial structure contacts the light-absorbing substrate;
providing a transparent substrate; and
using an elastic transparent adhesive material to bond the transparent substrate and the multi-layered AlGaAs epitaxial structure, wherein the light-absorbing substrate is removed after the transparent substrate is bonded to the second side of the multi-layered AlGaInP epitaxial structure.

2. The method according to claim 1, wherein the light-absorbing substrate is GaAs.

3. The method according to claim 1, wherein the LED epitaxial structure is an AlGaAs homostructure.

4. The method according to claim 1, wherein the LED epitaxial structure is an AlGaAs heterostructure.

5. The method according to claim 1, wherein the LED epitaxial structure is an AlGaAs double heterostructure.

6. The method according to claim 1, wherein the LED epitaxial structure is an AlGaAs quantum well.

7. The method according to claim 1, wherein the elastic transparent adhesive material is BCB (B-staged bisbenzocyclobutene) resin.

8. The method according to claim 1, wherein the elastic transparent adhesive material is epoxy resin.

9. The method according to claim 1, wherein the transparent substrate is sapphire.

10. The method according to claim 1, wherein the transparent substrate is glass.

11. The method according to claim 1, wherein the transparent substrate is GaP or GaAsP.

12. The method according to claim 1, wherein the transparent substrate is ZnSe, ZnS or ZnSSe.

13. The method according to claim 1, wherein the transparent substrate is SiC.

14. The method according to claim 1, wherein the step of bonding the transparent substrate and the multi-layered AlGaAs epitaxial structure is performed in the following steps: first stage: performing a heating and pressing step in a temperature between 60° C. and 100° C.; second stage: performing a heating and pressing step in a temperature between 200° C. and 600° C.

* * * * *

UNITED STATES PATENT AND TRADEMARK OFFICE
CERTIFICATE OF CORRECTION

PATENT NO. : 6,709,883 B2
APPLICATION NO. : 09/828060
DATED : March 23, 2004
INVENTOR(S) : Kuang-Neng Yang, Tzer-Perng Chen and Chih-Sung Chang It is certified that error appears in the above-identified patent and that said Letters Patent is hereby corrected as shown below:

Column 5, line 26, in claim 1, "AlGaInP" should be changed to --AlGaAs--.

Column 5, line 28, in claim 1, "AlGaInP" should be changed to --AlGaAs--.

Column 6, line 1, in claim 1, "AlGaInP" should be changed to --AlGaAs--.

Signed and Sealed this
Twentieth Day of March, 2012

David J. Kappos
*Director of the United States Patent and Trademark Office*